(12) United States Patent
Hoilien

(10) Patent No.: US 11,329,147 B2
(45) Date of Patent: May 10, 2022

(54) INSULATED GATE BIPOLAR TRANSISTOR WITH EPITAXIAL LAYER FORMED ON RECOMBINATION REGION

(71) Applicant: Polar Semiconductor, LLC, Bloomington, MN (US)

(72) Inventor: Noel Hoilien, Minneapolis, MN (US)

(73) Assignee: Polar Semiconductor, LLC, Bloomington, MN (US)

( * ) Notice: Subject to any disclaimer, the term of this patent is extended or adjusted under 35 U.S.C. 154(b) by 219 days.

(21) Appl. No.: 15/929,591

(22) Filed: May 12, 2020

(65) Prior Publication Data

US 2021/0359115 A1    Nov. 18, 2021

(51) Int. Cl.
| | | |
|---|---|---|
| H01L 29/739 | (2006.01) | |
| H01L 29/06 | (2006.01) | |
| H01L 29/66 | (2006.01) | |
| H01L 21/265 | (2006.01) | |
| H01L 21/761 | (2006.01) | |
| H01L 29/10 | (2006.01) | |

(52) U.S. Cl.
CPC .... H01L 29/7397 (2013.01); H01L 21/26513 (2013.01); H01L 21/761 (2013.01); H01L 29/0623 (2013.01); H01L 29/1095 (2013.01); H01L 29/66348 (2013.01)

(58) Field of Classification Search
CPC ........... H01L 29/7397; H01L 21/26513; H01L 21/761; H01L 29/0623; H01L 29/1095; H01L 29/66348
USPC .................................................. 257/139, 586
See application file for complete search history.

(56) References Cited

U.S. PATENT DOCUMENTS

| | | | |
|---|---|---|---|
| 2009/0050932 A1* | 2/2009 | Lu | H01L 29/66348 438/138 |
| 2009/0250705 A1 | 10/2009 | Watanabe et al. | |
| 2013/0277793 A1* | 10/2013 | Lee | H01L 29/1095 257/487 |
| 2014/0284625 A1 | 9/2014 | Kagotoshi et al. | |
| 2016/0087045 A1 | 3/2016 | Shimizu | |
| 2019/0035927 A1 | 1/2019 | Iwaya et al. | |
| 2021/0328054 A1 | 10/2021 | Hoilien | |

OTHER PUBLICATIONS

U.S. Appl. No. 17/460,747, filed Aug. 30, 2021, Hoilien et al.
Restriction Requirement dated Apr. 16, 2021 for U.S. Appl. No. 16/853,072; 6 Pages.
Response to Restriction Requirement dated Apr. 16, 2021 for U.S. Appl. No. 16/853,072; Response Filed Jun. 14, 2021; 1 Page.
U.S. Non-Final Office Action dated Aug. 5, 2021 for U.S. Appl. No. 16/853,072; 10 Pages.
Response to U.S. Non-Final Office Action dated Aug. 5, 2021 for U.S. Appl. No. 16/853,072; Response Filed Oct. 4, 2021; 12 Pages.
U.S. Notice of Allowance dated Dec. 21, 2021 for U.S. Appl. No. 16/853,072; 7 Pages.

* cited by examiner

*Primary Examiner* — Matthew E. Gordon
(74) *Attorney, Agent, or Firm* — Daly, Crowley, Mofford & Durkee, LLP

(57) ABSTRACT

In one aspect, a method of fabricating a transistor includes implanting ions into a first portion of a second epitaxial layer to form a recombination region, depositing a second portion of the second epitaxial layer having an n-type dopant on the recombination region, and forming trenches in the second portion of the second epitaxial layer.

7 Claims, 3 Drawing Sheets

INSULATED GATE BIPOLAR TRANSISTOR WITH EPITAXIAL LAYER FORMED ON RECOMBINATION REGION

BACKGROUND

An insulated-gate bipolar transistor (IGBT) is a three-terminal power semiconductor device. Typically, the IGBT is used as a switch in high-voltage applications. Compared to a power bipolar junction transistor (BJT) or a power metal-oxide-semiconductor field-effect transistor (MOSFET), the IGBT has a higher voltage rating and a higher current rating. Compared to a MOSFET, the IGBT has a higher switching frequency.

SUMMARY

In one aspect, a method of fabricating a transistor includes depositing a first epitaxial layer having a first n-type dopant, depositing a first portion of a second epitaxial layer having a second n-type dopant on the first epitaxial layer, implanting ions into the first portion of the second epitaxial layer to form a recombination region, depositing a second portion of the second epitaxial layer having the second n-type dopant on the recombination region, and forming trenches in the second portion of the second epitaxial layer, wherein the trenches comprise a trench gate of the transistor and a termination trench. The second portion of the second epitaxial layer is thicker than the first portion of the second epitaxial layer.

In another aspect, a transistor includes a first epitaxial layer having a first n-type dopant, a first portion of a second epitaxial layer having a second n-type dopant and disposed on the first epitaxial layer, a second portion of the second epitaxial layer having the second n-type dopant and disposed on a recombination region and trenches in the second portion of the second epitaxial layer. The first portion of the second epitaxial layer includes the recombination region implanted with non-dopant ions and the second portion of the second epitaxial layer is thicker than the first portion of the second epitaxial layer. The trenches include a trench gate of the transistor and a termination trench.

In a further aspect, an insulated-gate bipolar junction transistor (IGBT) includes a P+ doped substrate, a first epitaxial layer having a first n-type dopant and disposed on the P+ doped substrate; a first portion of a second epitaxial layer having a second n-type dopant and disposed on the first epitaxial layer, a second portion of the second epitaxial layer having a second n-type dopant and disposed on a recombination region, and trenches in the second portion of the second epitaxial layer. The first portion of the second epitaxial layer includes the recombination region implanted with non-dopant ions and the second portion of the second epitaxial layer is thicker than the first portion of the second epitaxial layer. The trenches include a trench gate of the IGBT and a termination trench and the P+ doped substrate is a collector of the IGBT.

DESCRIPTION OF THE DRAWINGS

The foregoing features may be more fully understood from the following description of the drawings. The drawings aid in explaining and understanding the disclosed technology. Since it is often impractical or impossible to illustrate and describe every possible embodiment, the provided figures depict one or more illustrative embodiments. Accordingly, the figures are not intended to limit the scope of the broad concepts, systems and techniques described herein. Like numbers in the figures denote like elements.

DETAIL DESCRIPTION

Described herein are techniques to fabricate a transistor with a recombination region. For example, using the techniques described herein, a transistor may be fabricated that has a faster switching capability than a traditional transistor. For example, the techniques described herein enable a transistor to be fabricated that uses less energy and takes less time to turn off. As used herein the turn off time is defined as an amount of time measured from when a gate is turned off for the current to fall from 100% of the on current to about 1% of the on current. As used herein the turn off energy is defined as the product of current times voltage integrated over the turn off time.

Figure 1:
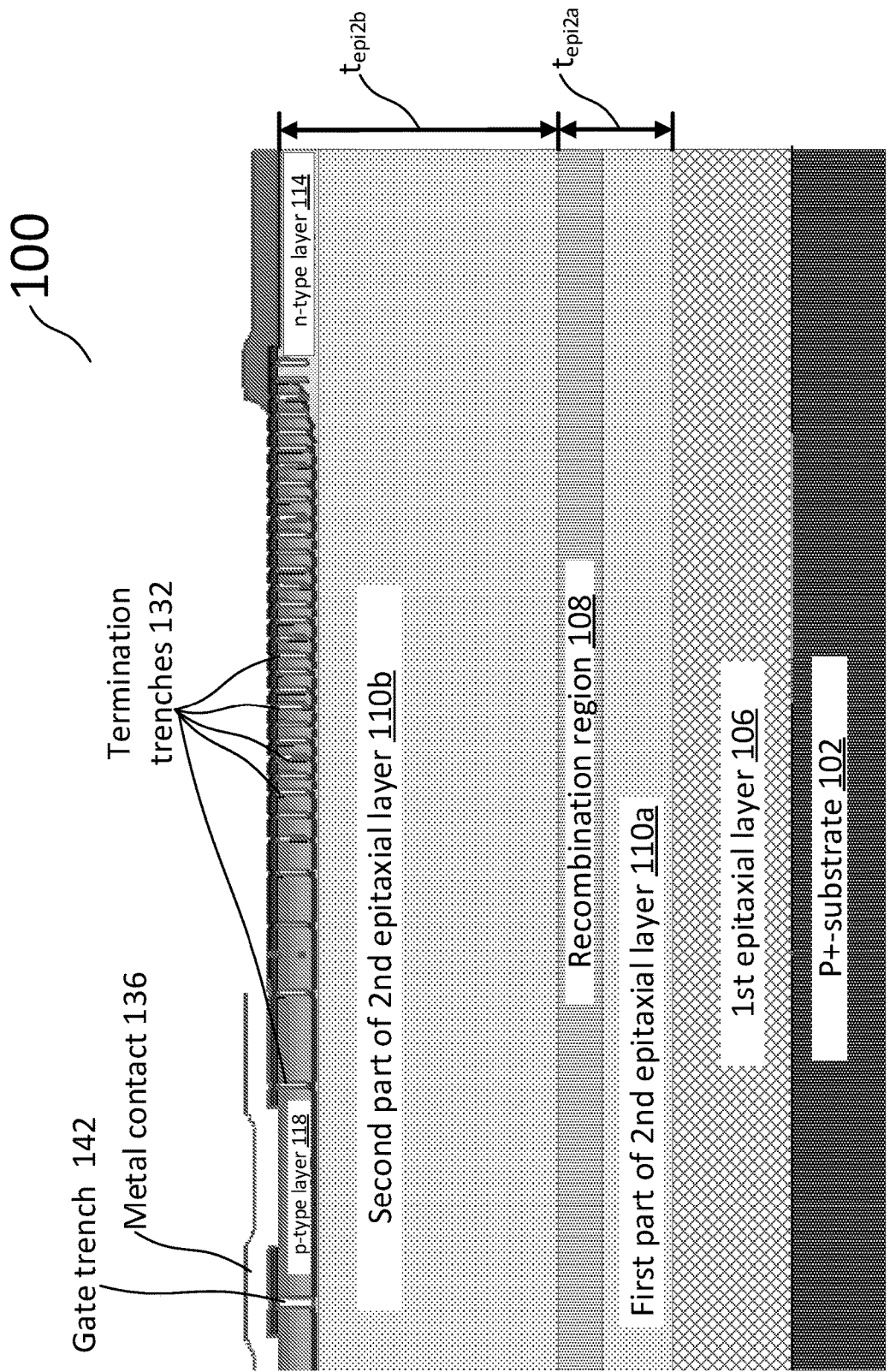
FIG. 1 is a diagram of an example of a transistor with a recombination region.

Referring to FIG. 1, a transistor 100 (e.g., a trench insulated-gate bipolar transistor (IGBT)) includes a P+-substrate 102 and a first epitaxial layer 106 on the P+-substrate 102. The P+-substrate 102 is a collector of the transistor 100.

The transistor 100 also includes a first portion of a second epitaxial layer 110a on the first epitaxial layer 106, and a second portion of the second epitaxial layer 110b on the first portion of a second epitaxial layer 110a. The first portion of a second epitaxial layer 110a includes a recombination region 108 which is in contact with the second portion of the second epitaxial layer 110b. The recombination region enables the recombination of holes and electrons.

The second portion of the second epitaxial layer 110b includes termination trenches 132 and is connected to a metal contact 136 thereby connecting the source/base of the transistor 100 to the metal contact 136. The purpose of the termination trenches is to manage the horizontal electric field at the die perimeter to ensure the termination breakdown voltage exceeds the main cell breakdown voltage. In one example, there are 30 termination trenches 132.

The second portion of the second epitaxial layer 110b includes an n-type doped layer 114, which is formed through ion implantation. In one example, the top surface of the n-type layer 114 (e.g., at about a half of a micron from the top surface) may be heavily doped forming an N+ implant. In one example, the N+ implant forms a low resistance region at the outer perimeter of an IGBT chip to improve the voltage uniformity along the chip perimeter.

The second portion of the second epitaxial layer 110b includes a p-type layer 118, which is formed through ion implantation. The p-type layer 118 is used as a base region for the transistor 100. A gate trench 142 extends within the p-type layer 118 connecting the second portion of the second epitaxial layer 110b to a metal contact 136 thereby connecting the base of the transistor to the metal contact 136. In one example, the gate trench 142 turns the IGBT 100 on and off. In one example, there may be more gate trenches than the gate trench 142 depicted in FIG. 1.

Figure 2:
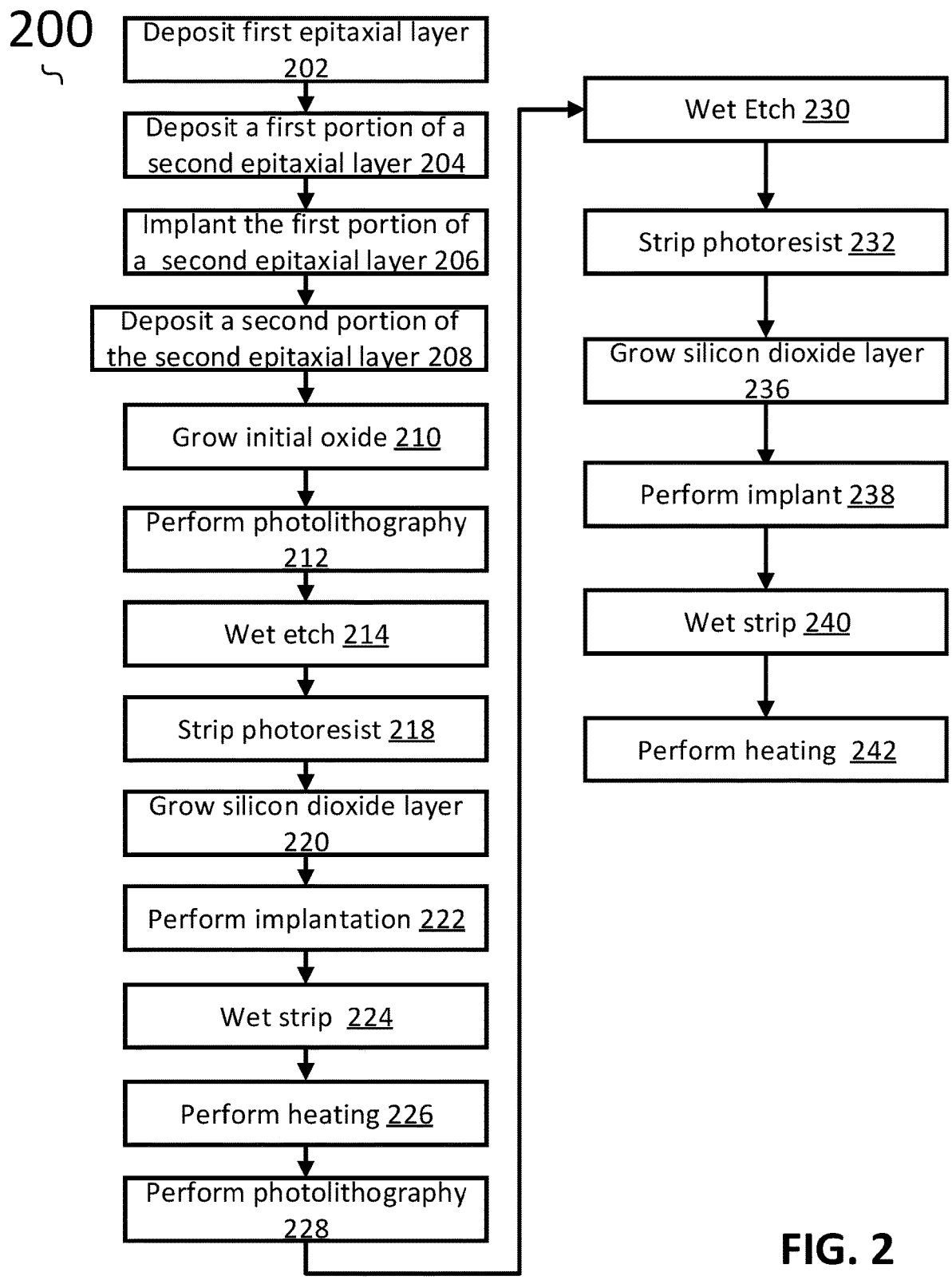
FIG. 2 is a flowchart of an example of a process to fabricate a transistor with the recombination region.

Referring to FIG. 2, an example of a process to form a recombination region (e.g., the recombination 108) is a process 200. In one example, the transistor may be the transistor 100 shown in FIG. 1.

Process 200 deposits a first epitaxial layer (202). For example, the first epitaxial layer 106 is deposited on the P+-substrate 102 (FIG. 1). In one example, the first epitaxial layer 106 is grown having a thickness of about 5 microns. In one example, the first epitaxial layer 106 includes phosphorous as a doping material and has a resistivity of about 0.023 Ohm-cm.

Process 200 deposits a first portion of a second epitaxial layer (204). For example, the first portion of the second epitaxial layer 110a is deposited on the first epitaxial layer 106 (FIG. 1). In one example, the first portion of the second epitaxial layer 110a is grown having a thickness, $t_{ep12a}$, of about 17 microns. In one example, the first portion of the second epitaxial layer 110a includes phosphorous as a doping material and has a resistivity of about 33 Ohm-cm. In other examples, the first portion of the second epitaxial layer 110a may have a thickness in the range of zero microns to 62 microns.

Process 200 performs implantation (206). For example, non-dopant ions are implanted into the first portion of the second epitaxial layer 110a (FIG. 1). The ion implantation of the first portion of the second epitaxial layer 110a forms the recombination region 108. In one example, processing block 206 introduces imperfections in the first portion of the second epitaxial layer 110a to enable holes and electrons to recombine.

In one particular example, the non-dopant ions are argon ions. In one example, the ion implantation uses argon ions with a dosing of at least $5.0 \times 10^{11}$ ions/cm$^2$. In another example, the ion implantation uses argon ions with a dosing of at least $5.0 \times 10^{12}$ ions/cm$^2$. In a further example, the ion implantation uses argon ions with a dosing of at least $5.0 \times 10^{13}$ ions/cm$^2$. In another example, the non-dopant ions are oxygen ions.

Process 200 deposits a second portion of the second epitaxial layer (208). For example, the second portion of the second epitaxial layer 110b is deposited on the recombination region 108 (FIG. 1). In one example, the second portion of the second epitaxial layer 110b is grown having a thickness, $t_{ep12b}$ of about 50 microns. In one example, the second portion of the second epitaxial layer 110b includes phosphorous as a doping material and has a resistivity of about 33 Ohm-cm. In other examples, the second portion of the second epitaxial layer 110b may have a thickness in the range of zero microns to 100 microns.

In some examples, the thickness of the second portion of the second epitaxial layer, $t_{ep12b}$ is at least three times larger than the thickness of the first portion of the second epitaxial layer $t_{ep12a}$. In some example, the thickness $t_{ep12b}$ is at least two times larger than the thickness $t_{ep12a}$.

Process 200 grows an initial oxide (210). For example, a 4000 Angstrom oxide layer is grown by wet oxidation at 1000° C.

Process 200 performs photolithography (212). For example, a photoresist is applied to the initial oxide and additional photolithographical steps are performed to remove portions of the photoresist exposing one or more portions of the initial oxide.

Process 200 wet etches (214). For example, the one or more exposed portions of the initial oxide are removed using a wet etching process.

Process 200 strips the photoresist (218). For example, the photoresist applied in processing block 212 is removed.

Process 200 grows a silicon dioxide layer (220). For example, a silicon dioxide layer is grown. In one example, the silicon dioxide layer is about 500 Angstroms thick.

Process 200 performs implantation (222). For example, a doping material is implanted through the silicon dioxide layer into the second portion of the second epitaxial layer 110b (FIG. 1). The implantation into the second portion of the second epitaxial layer 110b forms the n-type doped layer 114 (FIG. 1). In one particular example, the doping material is phosphorous. In one example, the peak doping of the phosphorous is about $1.0 \times 10^{16}$/cm$^3$. In some examples, the implantation is formed using ion implantation of at least 140 keV. In some examples, the ion implantation has a dosing of at least $3.2 \times 10^{12}$ ions/cm$^2$. In some example, the dosing ions (e.g., phosphorous ions) are implanted at an angle of at least 7 degrees.

Process 200 wet strips (224). For example, any surface impurities that might have been introduced during processing block 222 are removed.

Process 200 performs heating (226). For example, the-n-type doped region 114 is heated to further drive the doping material used in processing block 222 into the second portion of the second epitaxial layer 110b (FIG. 1). For example, the n-type doped region 114 is heated to 1200° C. for about 2 hours driving the n-type region 114 to a depth of about 7 um and growing an oxide to a thickness of about 4500 Angstroms.

Process 200 perform photolithography (228). For example, a photoresist is applied to the second portion of the second epitaxial layer 110b and additional photolithographical steps are performed to remove portions of the photoresist exposing one or more portions of the second portion of the second epitaxial layer 110b.

Process 200 performs wet etch (230). For example, the one or more exposed portions of the oxide grown in processing block 226 are removed using a wet etching process.

Process 200 strips photoresist (232). For example, the photoresist applied in processing block 228 is removed.

Process 200 grows silicon dioxide layer (236). For example, a silicon dioxide layer is grown. In one example, the silicon dioxide layer is about 500 Angstroms thick.

Process 200 performs implantation (238). For example, a doping material is implanted through the silicon dioxide layer grown in processing block 236 into the second portion of the second epitaxial layer 110b (FIG. 1). The implantation into the second portion of the second epitaxial layer 110b forms the p-type layer 118, which is a base region. In one particular example, the doping material is boron. In some examples, the ion implantation is formed using ion implantation of at least 70 keV. In some examples, the implantation has a dosing of at least $8.0 \times 10^{13}$ ions/cm'.

Process 200 wet strips (240). For example, any surface impurities that might have been introduced during processing block 238 are removed.

Process 200 performs heating (242). For example, the p-type layer 118 is heated to further drive the doping material used in processing block 238 into the second portion of the second epitaxial layer 110b (FIG. 1). For example, the p-type layer 118 is heated to 1150° C. for more than 5 hours driving the p-type layer 118 to a depth of about 4 um and growing an oxide to a thickness of about 4500 Angstroms.

Figure 3:
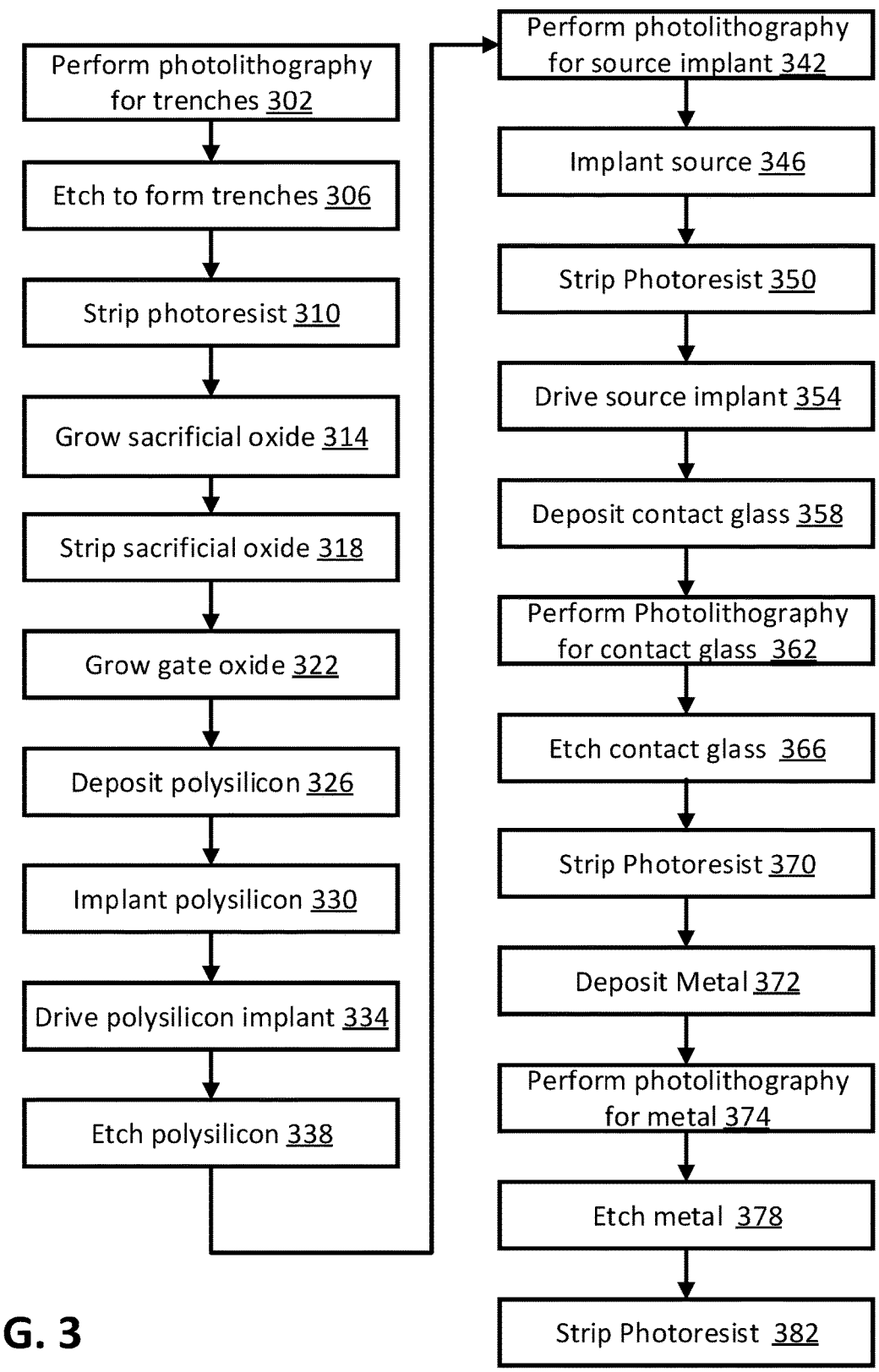
FIG. 3 is a flowchart of an example of a process to complete fabrication of the transistor in FIG. 1 after the process of FIG. 2.

Referring to FIG. 3, an example of a process to complete fabrication of a transistor (e.g., the transistor 100 in FIG. 1) after the process of FIG. 2 is a process 300. One of ordinary skill in the art would recognize that other processes may be used than the process 300 to fabricate a transistor with a recombination region 108.

Process 300 performs photolithography for trenches (302). For example, a photoresist is applied to the second portion of the second epitaxial layer 110b (FIG. 1) and additional photolithographical steps are performed to remove portions of the photoresist exposing one or more portions of the second portion of the second epitaxial layer 110b.

Process 300 etches to form the trenches (306). For example, the one or more exposed portions of the second portion of the second epitaxial layer 110b are removed to form trenches using a dry or wet etching process. For example, the gate trench 142 and the termination trenches 132 are formed.

Process 300 strips the photoresist (310). For example, the photoresist applied in processing block 302 is removed.

Process 300 grows sacrificial oxide (314). For example, a 1500 Angstrom oxide layer is grown by wet oxidation at a 1000° C.

Process 300 strips the sacrificial oxide (318). For example, wet etching techniques are used to remove the sacrificial oxide. In one example, all of the sacrificial oxide is removed.

Process 300 grows gate oxide (322). For example, a gate oxide that is 1000 Angstroms thick is grown using wet oxidation techniques at 900° C.

Process 300 deposits polysilicon (326). For example, a 15,000 Angstrom thick layer of polysilicon is deposited using low pressure chemical vapor deposition (LPCVD) on the gate oxide.

Process 300 implants polysilicon (330). For example, a doping material is implanted through the one or more exposed portions of the silicon dioxide layer into (FIG. 1). In one example, the polysilicon is implanted with phosphorous. In one example, the phosphorous is implanted at 70 keV and at a doping level greater than $1 \times 10^{16}/cm^3$.

Process 300 drives polysilicon implant (334). For example, the polysilicon is heated to 1100° C.

Process 300 etches the polysilicon (338). For example, the polysilicon may be etched using dry etching techniques. In one example, all of the polysilicon is removed except for polysilicon in the trenches (e.g., termination trenches 132 and gate trench 142).

Process 300 performs photolithography for source implant (342). For example, a photoresist is applied to the source and additional photolithographical steps are performed to remove portions of the photoresist exposing one or more portions of the source.

Process 300 implants source (346). For example, the exposed portions of the source are implanted with arsenic. In one example, the arsenic is implanted at 140 keV and at a dosing level of about $2 \times 10^{15}/cm^2$.

Process 300 strips the photoresist (350). For example, the photoresist applied in processing block 342 is removed.

Process 300 drives source implant (354). For example, the contact is heated to 1100° C. for 30 minutes to drive the arsenic.

Process 300 deposits contact glass (358). For example, a 7000 Angstrom borophosphosilicate glass (BPSG) layer is added and a 3000 Angstrom undoped silane glass (USG) layer is added.

Process 300 performs photolithography for contact glass (362). For example, a photoresist is applied to the contact glass and additional photolithographical steps are performed to remove portions of the photoresist exposing one or more portions of the contact glass.

Process 300 etches the contact glass (366). For example, the one or more exposed portions of the contact glass may be etched using dry or wet etching techniques.

Process 300 strips the photoresist (370). For example, the photoresist applied in processing block 362 is removed.

Process 300 deposits a metal (372). For example, a layer of metal is deposited on the contact using, for example, sputtering techniques. In one example, the metal layer includes aluminum silicon.

Process 300 performs photolithography for the metal (374). For example, a photoresist is applied to the metal and additional photolithographical steps are performed to remove portions of the photoresist exposing one or more portions of the metal.

Process 300 etches metal (378). For example, the one or more exposed portions of the metal are etched using dry or wet etching techniques.

Process 300 strips the photoresist (382). For example, the photoresist applied in processing block 374 is removed.

The processes described herein are not limited to the specific examples described. For example, the processes 200 and 300 are not limited to the specific processing order of FIGS. 2 and 3, respectively. Rather, any of the processing blocks of FIGS. 2 and 3 may be re-ordered, combined or removed, performed in parallel or in serial, as necessary, to achieve the results set forth above.

Elements of different embodiments described herein may be combined to form other embodiments not specifically set forth above. Various elements, which are described in the context of a single embodiment, may also be provided separately or in any suitable subcombination. Other embodiments not specifically described herein are also within the scope of the following claims.

What is claimed is:

1. A method of fabricating a transistor, comprising:
   depositing a first epitaxial layer having a first n-type dopant;
   depositing a first portion of a second epitaxial layer having a second n-type dopant on the first epitaxial layer;
   implanting ions into the first portion of the second epitaxial layer to form a recombination region;
   depositing a second portion of the second epitaxial layer having the second n-type dopant on the recombination region, wherein the second portion of the second epitaxial layer is thicker than the first portion of the second epitaxial layer; and
   forming trenches in the second portion of the second epitaxial layer, wherein the trenches comprise a trench gate of the transistor and a termination trench.

2. The method of claim 1, wherein the second portion of the second epitaxial layer is twice as thick as the first portion of the second epitaxial layer.

3. The method of claim 1, wherein the second portion of the second epitaxial layer is thrice as thick as the first portion of the second epitaxial layer.

4. The method of claim 1, wherein the ions are from an element that is a different element from the second n-type dopant.

5. The method of claim 4, wherein implanting the ions into the first portion of the second epitaxial layer to form the recombination region comprises implanting one of argon ions or oxygen ions into the first portion of the second epitaxial layer.

6. The method of claim 1, wherein depositing the first epitaxial layer comprises depositing the first epitaxial layer on a doped substrate, wherein the doped substrate is a collector of the transistor.

7. The method of claim 6, wherein the doped substrate is a P+ doped substrate.

* * * * *

UNITED STATES PATENT AND TRADEMARK OFFICE
CERTIFICATE OF CORRECTION

PATENT NO. : 11,329,147 B2
APPLICATION NO. : 15/929591
DATED : May 10, 2022
INVENTOR(S) : Noel Hoilien It is certified that error appears in the above-identified patent and that said Letters Patent is hereby corrected as shown below:

In the Specification

Column 3, Line 50, delete "example," and replace with --examples,--.

Column 4, Line 11, delete "example," and replace with --examples,--.

Column 4, Line 18, delete "region 114" and replace with --layer 114--.

Column 4, Line 21, delete "region 114" and replace with --layer 114--.

Column 4, Line 25, delete "perform" and replace with --performs--.

Column 4, Line 48, delete "ions/cm'." and replace with --ions/$cm^2$.--.

Column 5, Line 15, delete "at a" and replace with --at--.

Signed and Sealed this
Fifteenth Day of August, 2023

Katherine Kelly Vidal
*Director of the United States Patent and Trademark Office*